(12) United States Patent
Cha

(10) Patent No.: US 7,095,069 B2
(45) Date of Patent: Aug. 22, 2006

(54) MAGNETORESISTIVE RANDOM ACCESS MEMORY, AND MANUFACTURING METHOD THEREOF

(76) Inventor: Seon Yong Cha, #910-502 Jueun President Apt., 1255 Bunpyeong-dong, Heungdeok-gu, Cheongju-si, Chungcheongbuk-do (KR) 361-201

( * ) Notice: Subject to any disclaimer, the term of this patent is extended or adjusted under 35 U.S.C. 154(b) by 0 days.

(21) Appl. No.: 10/734,294

(22) Filed: Dec. 15, 2003

(65) Prior Publication Data

US 2004/0175887 A1    Sep. 9, 2004

(30) Foreign Application Priority Data

Mar. 3, 2003  (KR) .................. 10-2003-0013062

(51) Int. Cl.
*H01L 31/119* (2006.01)
(52) U.S. Cl. .................. 257/295; 257/421; 365/157; 365/171; 365/173
(58) Field of Classification Search .............. 365/157, 365/171, 173; 357/295, 421
See application file for complete search history.

(56) References Cited

U.S. PATENT DOCUMENTS

| | | |
|---|---|---|
| 5,940,319 A | 8/1999 | Durlam et al. |
| 6,175,515 B1 | 1/2001 | Peczalski et al. |
| 2002/0140016 A1* | 10/2002 | Cha .................. 257/302 |
| 2003/0067800 A1 | 4/2003 | Koganei |

FOREIGN PATENT DOCUMENTS

| | | |
|---|---|---|
| JP | 5226635 | 9/1993 |
| KR | 2002-0076460 | 10/2002 |

* cited by examiner

*Primary Examiner*—Thomas L. Dickey
(74) *Attorney, Agent, or Firm*—Heller Ehrman LLP

(57) ABSTRACT

The present invention discloses a magnetoresistive random access memory (MRAM) and a manufacturing method thereof. The whole cells are connected to each other by using a substrate as a ground terminal and a vertical structure field effect transistor (FET) for connecting the cells to the bit line. Thus, the MRAM is easily manufactured without requiring a special process for isolation of each cell. The MRAM uses the vertical structure FET to simplify the whole manufacturing process. An MTJ cell mask process which is essential in a general horizontal structure FET is omitted, to improve a speed of the MRAM and attain high integration of the MRAM.

3 Claims, 10 Drawing Sheets

MAGNETORESISTIVE RANDOM ACCESS MEMORY, AND MANUFACTURING METHOD THEREOF

BACKGROUND OF THE INVENTION

1. Field of the Invention

The present invention relates to a magnetoresistive random access memory (MRAM) and a manufacturing method thereof, and more particularly to an MRAM and a manufacturing method thereof which can simplify the whole process and increase a memory speed by improving an MRAM cell structure.

2. Description of the Background Art

Most of the semiconductor memory manufacturing companies have developed an MRAM using a ferromagnetic material as one of the next generation memory devices.

The MRAM is a memory device for reading and writing data by forming multi-layer ferromagnetic thin films, and sensing current variations according to magnetization directions of the respective thin films. The MRAM has a high speed, low power consumption and high integration density because of the special properties of the magnetic thin films, and performs a nonvolatile memory operation like a flash memory.

The MRAM research is still in its early stage, and mostly concentrated on the formation of multi-layer magnetic thin films, less on a unit cell structure and a peripheral sensing circuit, etc.

FIG. 1 is a cross-sectional diagram illustrating a magnetic tunnel junction (MTJ) cell having a multi-layer magnetic thin film structure for storing data in the conventional MRAM.

In general, the MTJ cell 5 includes a anti-ferroelectric thin film 1, a pinned ferromagnetic thin film 2, a thin insulation layer 3 which tunneling current flows through, and a free ferromagnetic thin film 4.

Here, the magnetization direction of the pinned ferromagnetic thin film 2 is pinned to one direction, and the anti-ferroelectric thin film 1 fixes the magnetization direction of the pinned ferromagnetic thin film 2. Conversely, the magnetization direction of the free ferromagnetic thin film 4 is changed by an external magnetic field.

When current flows through the MTJ cell 5 in the vertical direction, tunneling current is generated through the insulation layer 3. When the pinned ferromagnetic thin film 2 and the free ferromagnetic thin film 4 have the same magnetization direction, the tunneling current increases, and when the pinned ferromagnetic thin film 2 and the free ferromagnetic thin film 4 have opposite magnetization directions, the tunneling current decreases.

This phenomenon is called a tunneling magnetoresistance (TMR) effect. The magnetization direction of the free ferromagnetic thin film 4 can be sensed by sensing the amount of the tunneling current, and thus data stored in the cell can be read in the read operation.

In the write operation, the magnetization direction of the free ferromagnetic thin film 4 is decided according to polarity of current by a level of voltage transmitted to a write word line, and thus the MTJ cell 5 stores a data of '0' or '1'.

FIG. 2a is an exemplary diagram illustrating an MRAM cell using a horizontal structure field effect transistor (FET).

The unit cell of the MRAM includes one horizontal structure FET 9, an MTJ cell 5, a read word line 6, a write word line 8 and a bit line 7.

The read word line 6 is used to read data to control the FET 9. The write word line 8 receives current, forms an external magnetic field, and changes the magnetization direction of the free ferromagnetic thin film 4 of the MTJ cell 5 by using the external magnetic field, to store data. The bit line 7 transmits current to the MTJ cell 5 in the vertical direction, to sense the magnetization direction of the free ferromagnetic thin film 4.

In the read operation, the conventional MRAM transmits voltage to the read word line 6 to operate the FET 9, transmits current to the bit line 7, and senses the amount of current flowing through the MTJ cell 5.

In the write operation, the MRAM maintains an off state of the FET 9, transmits current to the write word line 8 and the bit line 7, and thus changes the magnetization direction of the free ferromagnetic thin film 4 of the MTJ cell 5 by the external magnetic field.

Here, the current is transmitted to the bit line 7 and the write word line 8 at the same time because the magnetic field is most actively generated in the vertical crossing point of the two metal lines. Accordingly, one cell can be selected from a few cell arrangements, FIG. 2b is a cross-sectional diagram illustrating an MRAM corresponding to the conventional MRAM cell of FIG. 2a.

A ground line 12 is formed on a source 10 of the horizontal structure FET 9, the read word line 6 is formed on a gate thereof, and a conductive layer 13, a contact plug 14, a conductive layer 15 and a contact plug 16 are sequentially formed on a drain 11 thereof. A connection layer 17 is formed on the write word line 8, and the MTJ cell 5 and the bit line 7 are stacked on the connection layer 17.

One of the biggest problems in the manufacturing process of the MRAM is to control surface roughness of the lower structure in which one MTJ cell 5 is formed below a few nm. In the MRAM of FIG. 2b, the write word line 8 and the connection layer 17 are formed in the lower portion of the MTJ cell 5, and thus surface roughness is hardly controlled below a few nm.

In addition, the conventional MRAM includes two word lines and one bit line per unit cell as well as a ground line for grounding, namely four metal lines, which increases surface resistances. It is very important to control the resistances.

When the transistor is small, it is much more difficult to control the external resistance of the transistor. Such resistances in combination with the resistances of the MTJ cell have detrimental effects on the cell operation. A short channel effect and resistance variation of the horizontal structure FET deteriorate a few hundreds Giga-level integration of the MRAM.

SUMMARY OF THE INVENTION

The present invention is achieved to solve the above problems. Accordingly, it is a primary object of the present invention to provide a high integration magnetoresistive random access memory which can minimize a short channel effect and resistance variation of a transistor by using a vertical structure transistor.

Another object of the present invention is to provide a high integration magnetoresistive random access memory which can simplify the whole process by forming a magnetic tunnel junction cell according to a self-alignment method, without using a special mask process.

In order to achieve the above-described objects of the invention, there is provided a magnetoresistive random access memory including a vertical structure field effect transistor, wherein the vertical structure field effect transistor has its channel column and drain sequentially formed on an insulation substrate, its source area formed on the insulation substrate on which the channel columns have not been formed, and its read word lines formed around the channel columns to serve as gates, a contact line, a magnetic tunnel junction cell, a bit line and a write word line are sequentially formed on the drain area, and patterns of the magnetic tunnel junction cell are formed according to the self-alignment method, without requiring a special mask process for forming the patterns.

According to one aspect of the invention, a manufacturing method of a magnetoresistive random access memory includes: a first process for forming a vertical structure field effect transistor by sequentially forming a channel column and a drain on an insulation substrate, a source area on the insulation substrate on which the channel columns have not been formed, and read word lines around the channel columns serving as gates; a second process for forming a magnetic tunnel junction cell and a bit line on the vertical structure field effect transistor, and patterning the magnetic tunnel junction cell according to the self-alignment method aligning the magnetic tunnel junction cell in a matrix shape, by using the bit line and read word line masks; and a third process for patterning and etching a write word line on the bit line in the right angle direction to the bit line.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

An MRAM and a manufacturing method thereof in accordance with a preferred embodiment of the present invention will now be described in detail with reference to the accompanying drawings.

Figure 1:
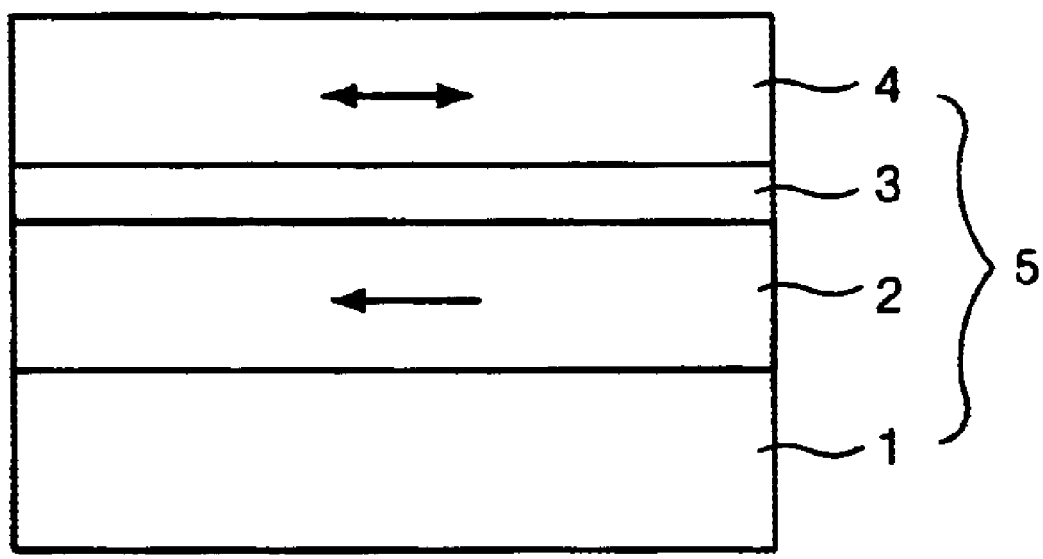
FIG. 1 is a cross-sectional diagram illustrating a conventional MTJ cell.
Figure 2A:
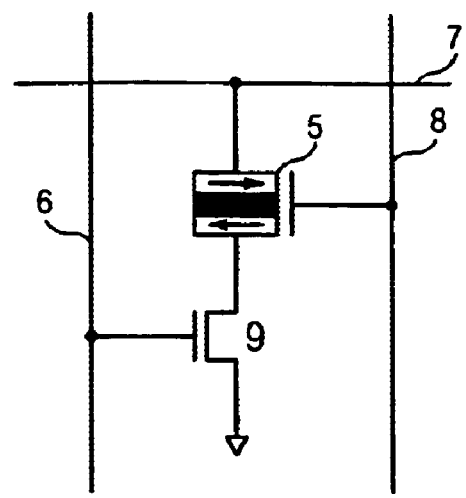
FIGS. 2a and 2b are an exemplary diagram and a cross-sectional diagram illustrating a conventional MRAM using a horizontal structure FET.
Figure 2B:
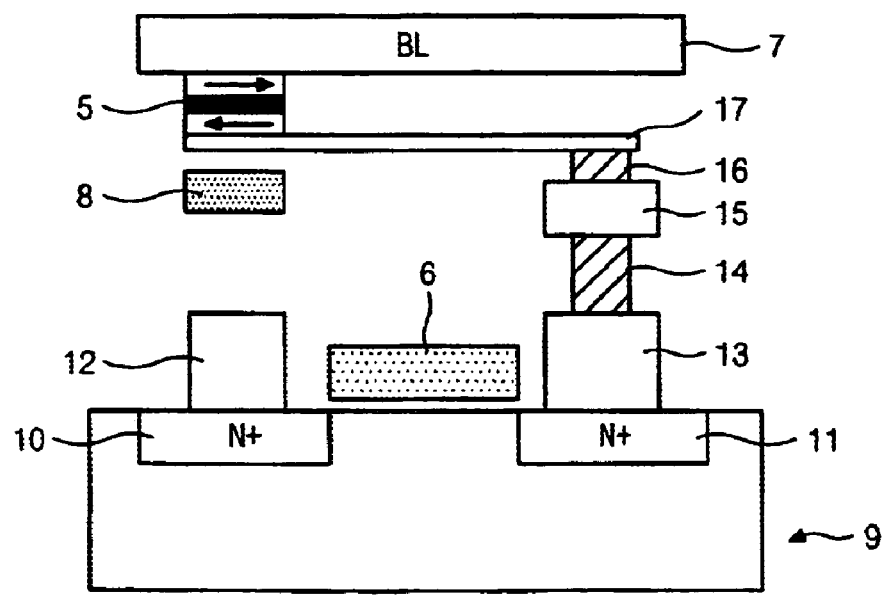
Figure 3A:
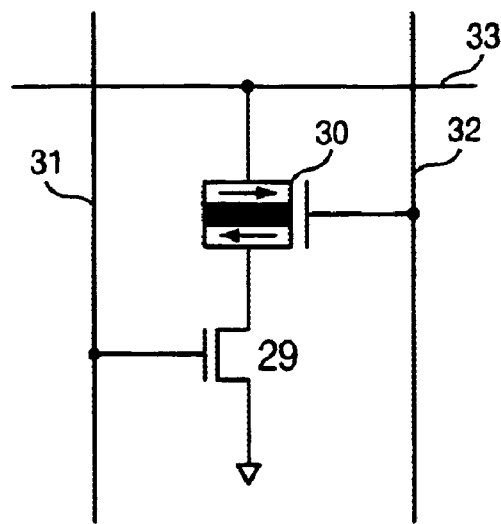
FIGS. 3a and 3b are an exemplary diagram and a cross-sectional diagram illustrating an MRAM using a vertical structure FET in accordance with the present invention.

FIG. 3a is an exemplary diagram illustrating an MRAM using a vertical structure FET in accordance with the present invention.

The MRAM includes a vertical structure FET 29, an MTJ cell 30, a read word line 31, a write word line 32 and a bit line 33.

The read word line 31 is used to read data to control the vertical structure FET 29. The write word line 32 receives current, forms an external magnetic field, and stores data according to variations of the magnetization direction of a free ferromagnetic thin film of the MTJ cell 30. The bit line 33 transmits current to the MTJ cell 30 in the vertical direction, to sense the magnetization direction of the free ferromagnetic thin film.

Figure 3B:
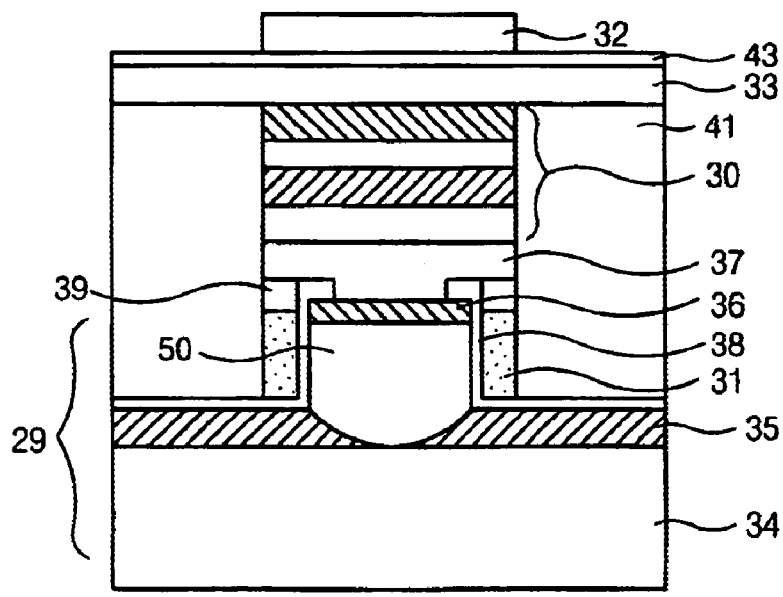

FIG. 3b is a cross-sectional diagram illustrating the MRAM using the vertical structure FET corresponding to FIG. 3a in accordance with the present invention.

A source 35, a channel 50 and a drain 36 are stacked on an insulation substrate 34, and the read word lines 31 separated by an oxide film 38 are formed around the channel 50.

A drain contact line 37 is formed on the drain 36, and the MTJ cell 30 is stacked on the contact line 37. In addition, the bit line 33 is formed on the MTJ cell 30, and the write word line 32 is formed on the bit line 33.

The MRAM using the vertical structure FET 29 simplifies the lower structure of the MTJ cell 30, and thus easily controls surface toughness thereof. Moreover, the MRAM attains high speed and high density by simplifying the whole process.

Figure 4A:
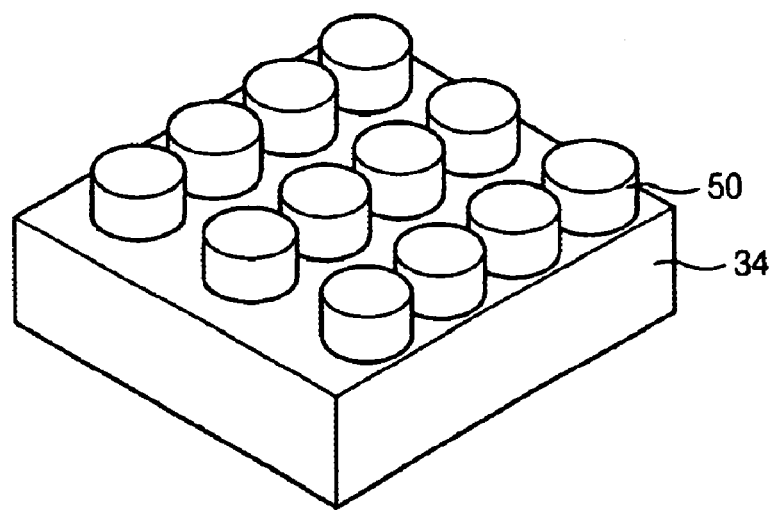
FIGS. 4a to 4n are flowcharts showing sequential steps of a manufacturing method of an MRAM using a vertical structure FET in accordance with the present invention.
Figure 4B:
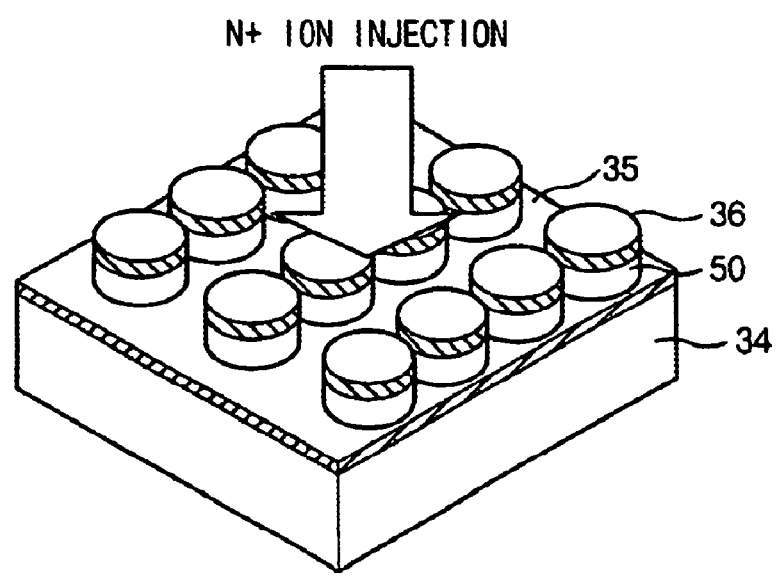
Figure 4C:
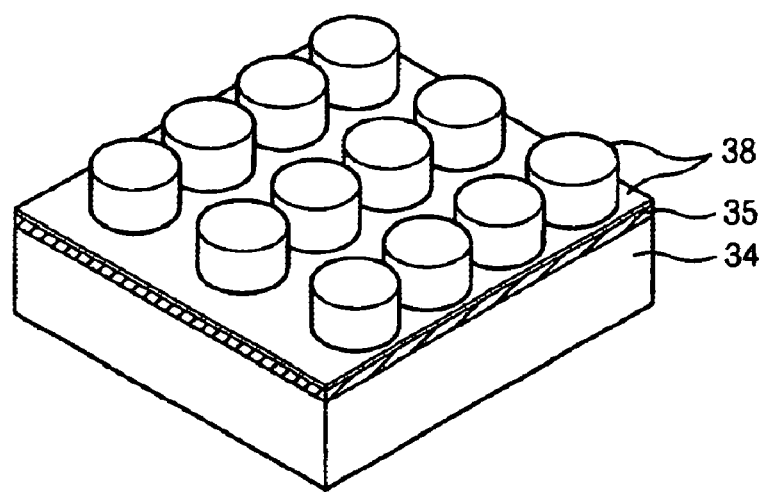
Figure 4D:
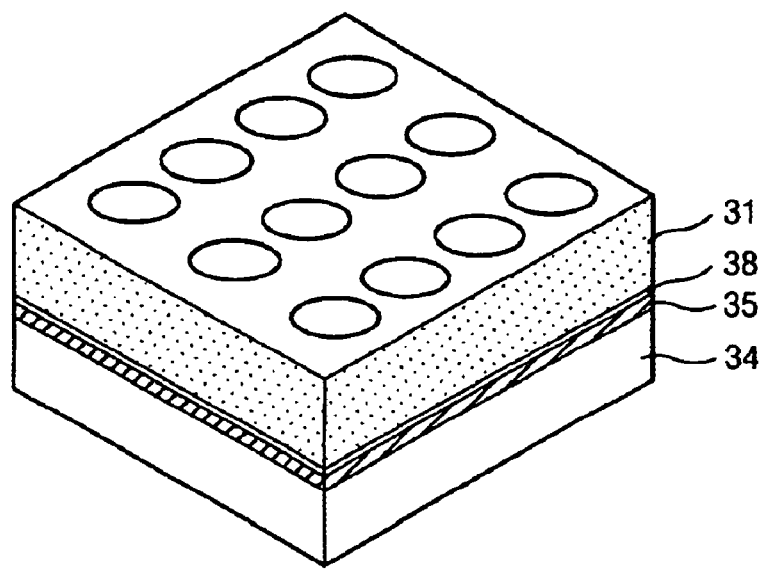
Figure 4E:
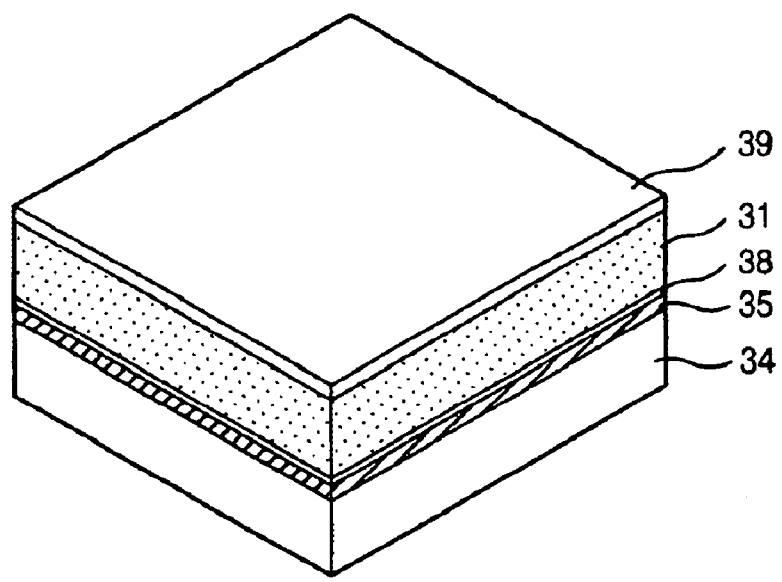
Figure 4F:
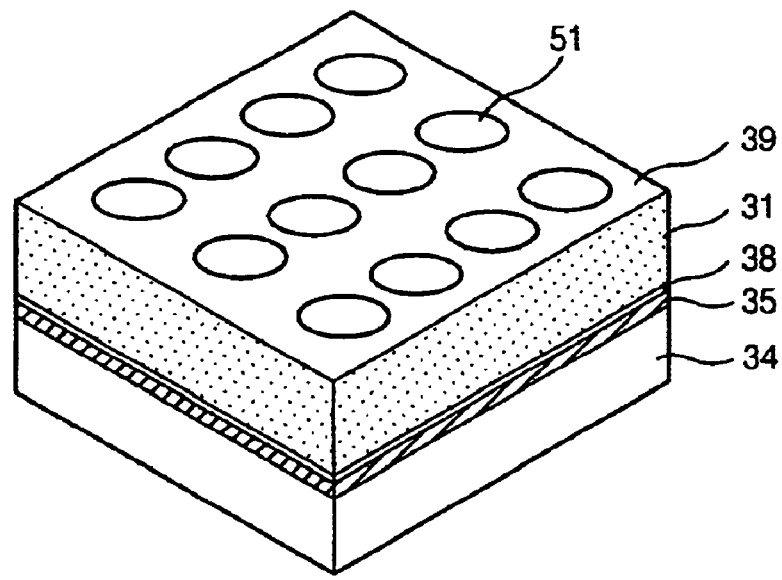
Figure 4G:
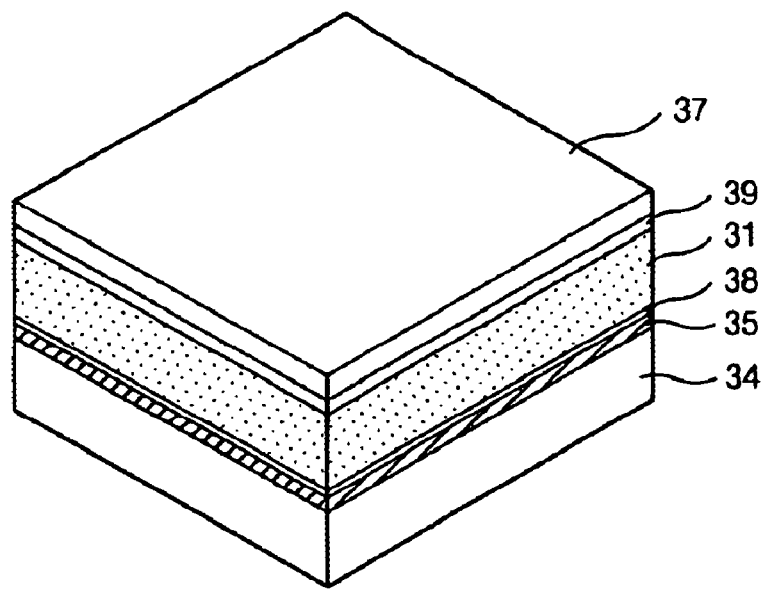
Figure 4H:
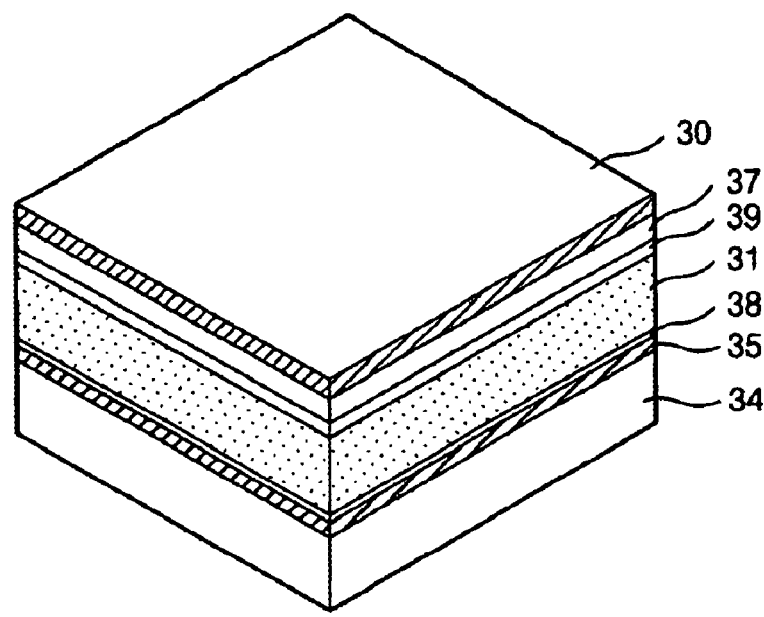
Figure 4I:
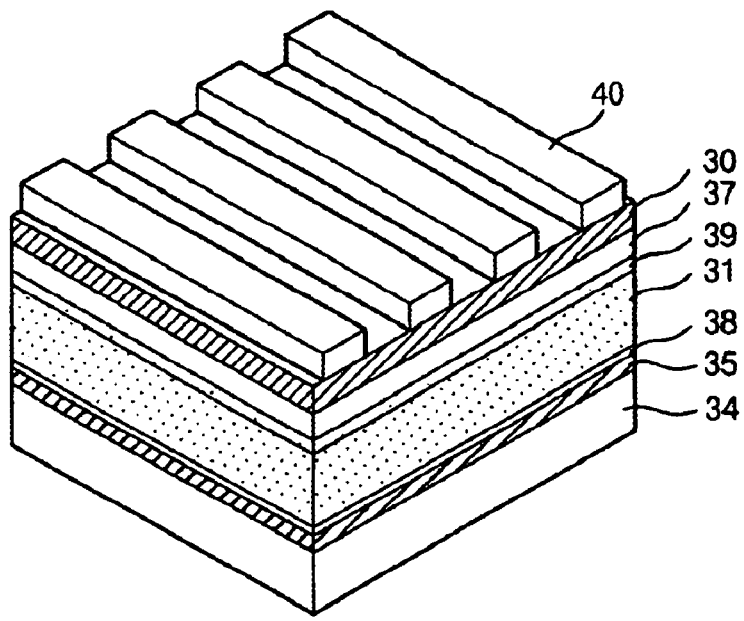
Figure 4J:
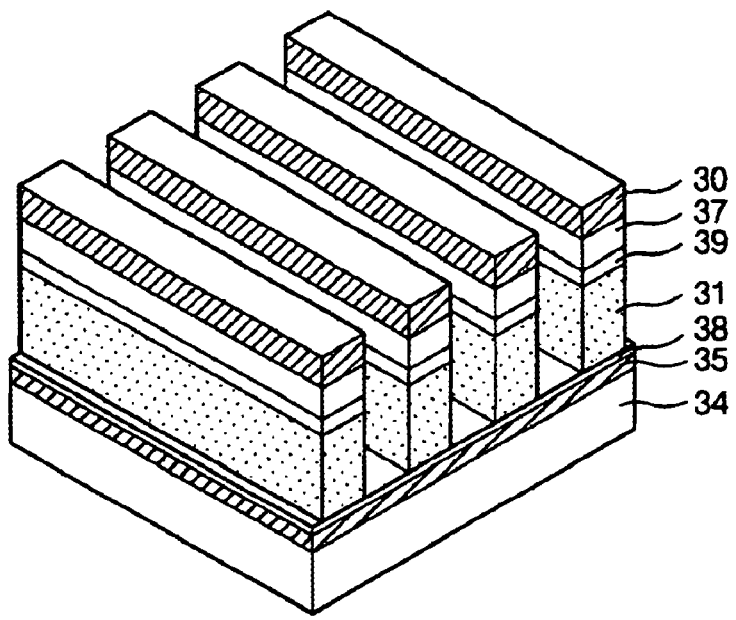
Figure 4K:
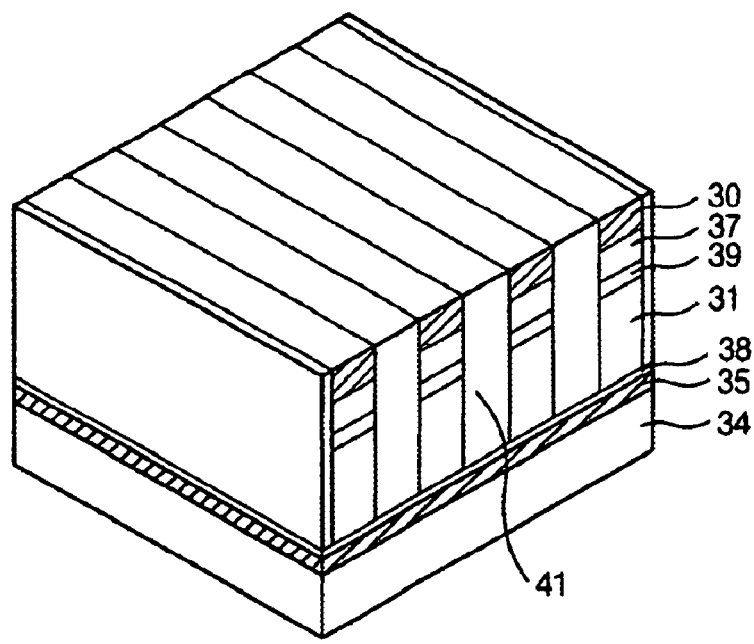
Figure 4L:
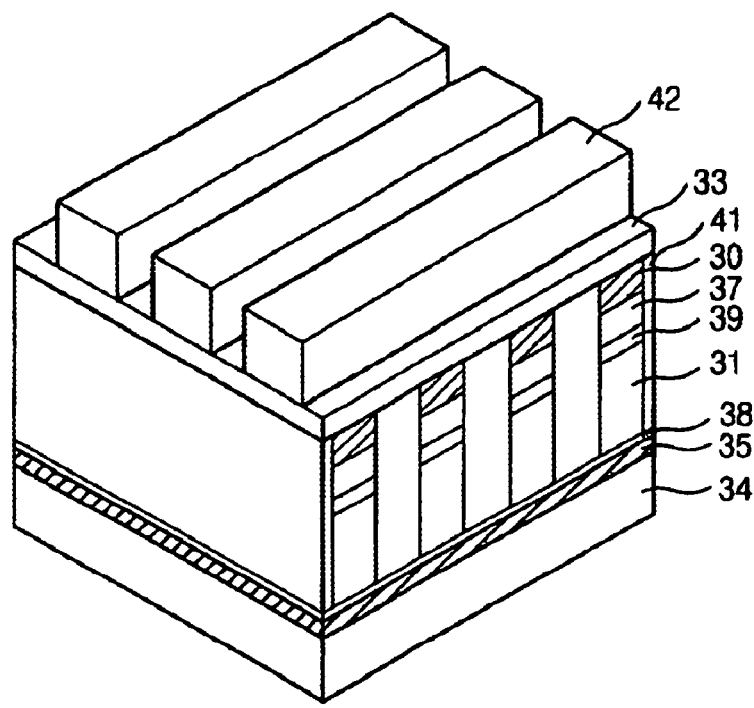
Figure 4M:
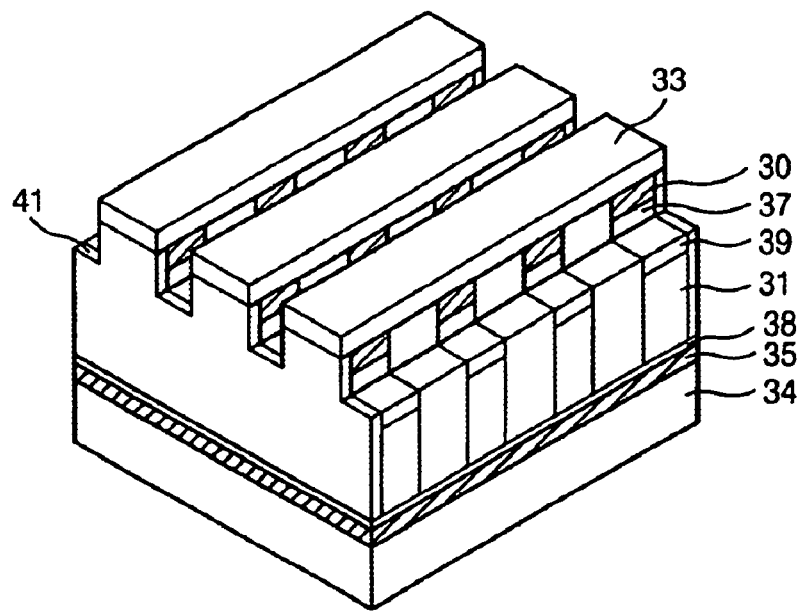
Figure 4N:
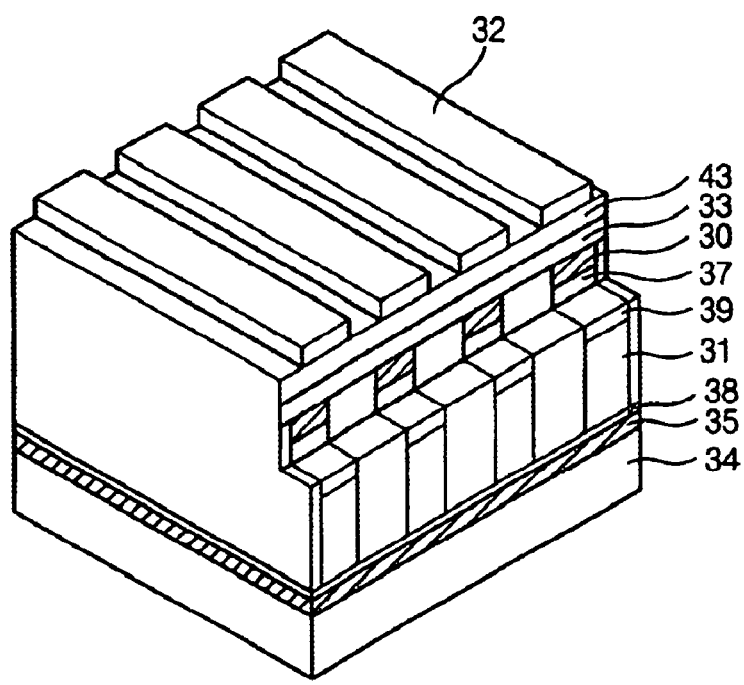

On the other hand, FIGS. 4a to 4n are flowcharts showing sequential steps of a manufacturing method of the MRAM in accordance with the present invention.

Referring to FIG. 4a, a cylindrical Si column 50 is masked on the insulation substrate 34, to form a vertical structure channel.

As shown in FIG. 4b, the source 35 and the drain 36 are formed according to N+ ion implantation.

As depicted in FIG. 4c, the gate oxide film 38 is deposited on the whole surfaces of the source 35 and the drain 36 formed in the process of FIG. 4b and on the sidewalls of the cylindrical Si column 50, to form the vertical structure FET 29.

As illustrated in FIG. 4d, the read word line 31 comprised of polysilicon is deposited on the whole surface of the vertical structure FET 29 formed in the process of FIG. 4c, and a planarization process is performed thereon.

As shown in FIG. 4e, an interlayer insulation film 39 is deposited on the whole surface of the read word line 31.

Referring to FIG. 4f, a contact hole 51 is formed on the interlayer insulation film 39 for electrical connection of the MTJ cell 30 formed later and the drain 36 of the vertical structure FET 29.

As illustrated in FIG. 4g, a polysilicon contact material is deposited on the whole surface of the interlayer insulation film 39, to form the contact line 37. Accordingly, the upper MTJ cell 30 and the drain 36 of the vertical structure FET 29 are connected through the contact hole 51.

As shown in FIG. 4h, the MTJ cell 30 comprised of four thin films is sequentially deposited on the contact line 37 formed in the process of FIG. 4g.

As depicted in FIG. 4i, photoresist 40 is patterned by using the read word line 31 mask.

As shown in FIG. 4j, the resulting structure are etched to expose the side of the read wordline by using the photoresist 40 patterned in the process of FIG. 4i, thereby forming the gate. The MTJ cell 30 thin films are patterned in the same shape as the gate.

As illustrated in FIG. 4k, an interlayer insulation film 41 is deposited on the whole surface of the MTJ cell 30 patterned in the process of FIG. 4j, and a planarization process is performed thereon.

Referring to FIG. 4l, a metal line composing the bit line 33 is deposited on the whole surface of the interlayer insulation film 41 formed in the process of FIG. 4k. Here, the interlayer insulation film 41 prevents the bit line 33 from being connected to the vertical structure FET 29, when the bit line 33 is deposited. Thereafter, photoresist 42 is patterned in the right angle direction to the read word line 31 by using the bit line 33 mask.

As illustrated in FIG. 4m, the resulting structure are etched to expose the side contact line 37 by using the photoresist 42 patterned in the process of FIG. 4l, so that the MTJ cell 30 and the contact line 37 can be formed in the matrix shape. Here, the line-shaped thin films of the MTJ cell 30 are automatically transformed into the matrix thin films by the right angle direction bit line 33 mask. That is, the MTJ cell 30 can be formed according to the above-mentioned method, namely the self-alignment method, without using a special MTJ cell mask.

As shown in FIG. 4n, an interlayer insulation film 43 is deposited on the whole surface of the bit line 33 patterned in the process of FIG. 4m, a planarization process is performed thereon, and the write word line 32 is deposited on the whole surface of the interlayer insulation film 43. Then, the write word line 32 is patterned in the right angle direction to the bit line 33, and etched. Here, the interlayer insulation film 43 prevents the bit line 33 from being connected to the write word line 32, when the write word line 32 is deposited.

In accordance with the present invention, the MTJ cell 30 is formed according to the self-alignment method without requiring a special mask process. The mask process is performed merely to form the read word line and bit line patterns, thereby simplifying the whole process and improving integration of the MRAM.

As discussed earlier, in accordance with the present invention, surface roughness of the lower portion of the MTJ cell is easily controlled by using the vertical structure FET. In addition, the whole cells are grounded on the substrate and thus connected to each other. As a result, the MRAM is easily manufactured without requiring a special process for isolation of each cell. Furthermore, process expenses and time are reduced and integration of the MRAM is improved due to simplification of the process.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A magnetoresistive random access memory comprising:

a vertical structure field effect transistor including; channel column and drain area sequentially formed on an insulation substrate; source area formed on the insulation substrate on which the channel column has not been formed, and read word lines formed at both sides of around the channel column to serve as a gate; and a contact line, a magnetic tunnel junction cell, a bit line and a write word line sequentially formed on the drain area, wherein the magnetic tunnel junction cell is aligned in a matrix shape through the self-alignment method by using a bit line mask and a word line mask, without requiring a special mask process for forming the patterns of the magnetoresistive random access memory, wherein the magnetic tunnel junction cell is formed by sequentially stacking an anti-ferroelectric thin film, a pinned ferromagnetic thin film, an insulation layer and a free ferromagnetic thin film on the contact line.

2. The magnetoresistive random access memory of claim 1, wherein the source area and the drain area are formed according to ion implantation, and the channel column is comprised of silicon.

3. The magnetoresistive random access memory of claim 1, wherein the read word line is formed by depositing polysilicon.

* * * * *

UNITED STATES PATENT AND TRADEMARK OFFICE
CERTIFICATE OF CORRECTION

PATENT NO. : 7,095,069 B2  Page 1 of 1
APPLICATION NO. : 10/734294
DATED : August 22, 2006
INVENTOR(S) : Seon Yong Cha It is certified that error appears in the above-identified patent and that said Letters Patent is hereby corrected as shown below:

On the Title Page of the Patent, include Item (73) Assignee, and insert --Hynix Semiconductor Inc.--

Signed and Sealed this

Fourteenth Day of August, 2007

JON W. DUDAS
*Director of the United States Patent and Trademark Office*